United States Patent
Vugts et al.

(10) Patent No.: US 12,101,887 B2
(45) Date of Patent: Sep. 24, 2024

(54) PREVENTING LIQUID INGRESS IN A DEVICE

(71) Applicants: KONINKLIJKE PHILIPS N.V., Eindhoven (NL); NEDERLANDSE ORGANISATIE VOOR TOEGEPAST-NATUURWETENSCHAPPELIJK ONDERZOEK TNO, The Hague (NL)

(72) Inventors: Marinus Arnoldus Martinus Vugts, Beetsterzwaag (NL); Pascal Jean Henri Bloemen, Eindhoven (NL); Aristeidis Katsiorchis, Eindhoven (NL); Johannes Antonius Jansen, Utrecht (NL); Donald Thackray, Zuidlaren (NL); Christian Steven Van Eek, Leewarden (NL); Ramachandra Rao Ganesh, Groningen (NL); Stephan Harkema, Hilversum (NL)

(73) Assignees: KONINKLIJKE PHILIPS N.V., Eindhoven (NL); NEDERLANDSE ORGANISATIE VOOR TOEGEPAST-NATUURWETENSCHAPPELIJK ONDERZOEK TNO, The Hague (NL)

(*) Notice: Subject to any disclaimer, the term of this patent is extended or adjusted under 35 U.S.C. 154(b) by 179 days.

(21) Appl. No.: 17/914,927

(22) PCT Filed: Mar. 31, 2021

(86) PCT No.: PCT/EP2021/058389
§ 371 (c)(1),
(2) Date: Sep. 27, 2022

(87) PCT Pub. No.: WO2021/198317
PCT Pub. Date: Oct. 7, 2021

(65) Prior Publication Data
US 2023/0111487 A1    Apr. 13, 2023

(30) Foreign Application Priority Data

Apr. 2, 2020   (EP) .................................. 20167739

(51) Int. Cl.
*H05K 1/18* (2006.01)
*F21V 31/00* (2006.01)
(Continued)

(52) U.S. Cl.
CPC .......... *H05K 1/186* (2013.01); *F21V 31/005* (2013.01); *H05K 1/0283* (2013.01);
(Continued)

(58) Field of Classification Search
CPC ............... H05K 1/186; H05K 1/0283; H05K 2201/0129; H05K 2201/10106;
(Continued)

(56) References Cited

U.S. PATENT DOCUMENTS 9,601,671 B2    3/2017   Rogers
9,801,286 B2    10/2017  Heikkinen
(Continued)

FOREIGN PATENT DOCUMENTS

EP    2484956 A1    8/2012
EP    3405011 A1    11/2018
WO    2015166135 A1    11/2015

OTHER PUBLICATIONS

International Search Report and Written Opinion Dated May 11, 2021 for International Application No. PCT/EP2021/058389 Filed Mar. 31, 2021.
(Continued)

*Primary Examiner* — Hoa C Nguyen

(57) ABSTRACT

In an embodiment, a method of manufacturing (100) is described. The method comprises providing (102) a first layer defining a first inner surface (203a) and a first outer
(Continued)

surface (203b), a second layer defining a second inner surface (205a) and a second outer surface (205b), and an electrical component (206) positioned on the first inner surface or the second inner surface. The method further comprises attaching (104) the first and second layers together to create a device (200) comprising the first and second layers, wherein the first outer surface and the second outer surface define an external surface of the device. The device further comprises a sealed portion (208) defined by liquid-tight attachment between the first and second inner surfaces. In use of the device, the sealed portion prevents liquid ingress into the device between the first and second layers towards the electrical component.

15 Claims, 4 Drawing Sheets

(51) Int. Cl.
*H05K 1/02* (2006.01)
*F21Y 115/10* (2016.01)

(52) U.S. Cl.
CPC ... *F21Y 2115/10* (2016.08); *H05K 2201/0129* (2013.01); *H05K 2201/10106* (2013.01); *H05K 2201/10121* (2013.01); *H05K 2201/10977* (2013.01)

(58) Field of Classification Search
CPC .......... H05K 2201/10121; H05K 2201/10977; F21V 31/005; F21Y 2215/10
See application file for complete search history.

(56) References Cited

U.S. PATENT DOCUMENTS

| | | | |
|---|---|---|---|
| 10,288,800 B1 | 5/2019 | Keranen | |
| 2008/0220549 A1* | 9/2008 | Nall | F21V 31/005 438/26 |
| 2013/0051022 A1* | 2/2013 | Katzler | H01R 13/11 362/249.06 |
| 2014/0177220 A1* | 6/2014 | Miyata | H05K 3/225 362/235 |
| 2014/0334142 A1* | 11/2014 | Levante | F21S 4/22 362/222 |
| 2015/0377460 A1 | 12/2015 | Li | |
| 2016/0201861 A1* | 7/2016 | Meir | H05K 3/285 29/841 |
| 2017/0005077 A1 | 1/2017 | Kim | |
| 2018/0073706 A1* | 3/2018 | Palfreyman | F21V 23/003 |
| 2018/0220534 A1* | 8/2018 | Heikkinen | H01L 33/52 |
| 2018/0331079 A1* | 11/2018 | Wendt | H01L 33/56 |
| 2019/0021168 A1 | 1/2019 | Heikkinen | |
| 2019/0132946 A1* | 5/2019 | Yang | G02F 1/133305 |
| 2020/0028041 A1* | 1/2020 | Adams | F21V 7/0016 |

OTHER PUBLICATIONS

Written Opinion of the International Preliminary Examining Authority Dated Jul. 27, 2021 for International Application No. PCT/EP2021/058389 Filed Mar. 31, 2021.

International Report on Patentability Dated Jul. 13, 2022 For International Application No. PCT/EP2021/058389 Filed Mar. 31, 2021.

Global LED OLED QLED Magazine and News "Printed electronics for flexible solid-state lighting", Oct. 26, 2015.

* cited by examiner

PREVENTING LIQUID INGRESS IN A DEVICE

CROSS REFERENCE TO RELATED APPLICATIONS

This application is the U.S. National Phase application under 35 U.S.C. § 371 of International Application No. PCT/EP2021/058389 filed Mar. 31, 2021, which claims the benefit of European Patent Application Number 20167739.0 filed Apr. 2, 2020. These applications are hereby incorporated by reference herein.

FIELD OF THE INVENTION

The invention relates to a device and a method of manufacturing such a device in such a way to prevent liquid ingress into the device, for example, when the device comes into contact with liquid.

BACKGROUND OF THE INVENTION

Certain electronic devices may be constructed in multiple manufacturing stages. For example, in complex supply chains, various components used to construct such electronic devices may be manufactured at different sites by different processes. At the final stage of manufacture, the various components may be integrated together to form the end device. Since the various components may be manufactured at different sites and/or using different processes, the end device may not meet a certain specification in terms of the properties of the device such as dimensions, flexibility, robustness and liquid-tightness while ensuring quality and/or cost effectiveness of the end device.

Printed electronics may provide certain possibilities in terms of integration, miniaturization and/or quality of an end device such as device incorporating a flexible printed circuit board assembly (PCBA). However, where other components such as certain optoelectronic components, light rings, sensors and actuator setups are combined with such a PCBA, the manufacturing process may yield an end device which does not meet a specification or is somewhat limited in terms of a certain property such as dimensions, flexibility, robustness and liquid-tightness. For example, the end device may be bulky, difficult to form into a specified shape, lack robustness needed for a certain application such as in a consumer device and/or have insufficient liquid-tightness to meet a certain specification.

US 2017/005077 A1 describes an electronic device having control circuitry coupled to input-output devices such as a display. A flexible input-output device may be formed from an elastomeric substrate layer. The substrate layer may have signal paths to which components are mounted. Openings may be formed in the elastomeric substrate layer between the signal paths to create a stretchable mesh-shaped substrate.

US 2019/021168 A1 describes a method for manufacturing a multilayer structure for an electronic device. The method includes obtaining a flexible substrate film; printing a number of conductor traces on the flexible substrate film; and providing a number of electronic components on a first surface area of the flexible substrate film. The flexible substrate film further includes a second surface area adjacent to the first surface area. The method further includes molding first thermoplastic material on the number of electronic components and the related first surface area of the flexible substrate film accommodating the components; and molding second thermoplastic material on the adjacent second surface area and on at least part of the first surface area.

U.S. Ser. No. 10/288,800 B1 describes an integrated multilayer structure including a substrate film having a first side and an opposing second side; electronics including at least one light source, provided upon the first side and a number of electrical conductors, at least electrically coupled to the at least one light source.

US 2015377460 A1 describes modular lighting systems that comprise lighting strips physically and electrically connectable with one another by way of flexible connectors.

EP 2484956 A1 describes a flexible lighting element comprising a lighting strip of light sources, covered by an external covering in extrudable silicone elastomer material crosslinkable without heat where said lighting strip is placed between said external covering and a support in heat-conductive material whereon said strip rests.

SUMMARY OF THE INVENTION

Aspects or embodiments described herein relate to improving the manufacture of a device such as an electronic device. Aspects or embodiments described herein may obviate one or more problems associated with manufacturing a device to meet a certain specification.

According to a first aspect, a method is described. The method comprises providing a first layer defining a first inner surface and a first outer surface. The method further comprises providing a second layer defining a second inner surface and a second outer surface. The method further comprises providing an electrical component positioned on the first inner surface or the second inner surface. The method further comprises providing an electrical connection for the electrical component. The electrical connection is printed on the first layer or the second layer. The method further comprises attaching the first and second layers together to create a device comprising the first and second layers with the electrical component and the electrical connection positioned between the first and second layers, so that the electrical component and electrical connection are in contact with both the first inner surface and the second inner surface. The first outer surface and the second outer surface define an external surface of the device. The device further comprises a sealed portion defined by liquid-tight attachment between the first and second inner surfaces around the electrical connection. In use of the device, the sealed portion prevents liquid ingress into the device along the electrical connection between the first and second layers towards the electrical component. The electrical connection is configured to allow electrical communication with the electrical component via the sealed portion. An edge of the first layer is offset from an edge of and the second layers are configured-such that a portion of the electrical connection printed on the first layer or the second layer is exposed for connecting to an electrical power supply.

Some embodiments relating to the first or second aspects are described below. In some embodiments, the electrical connection extends along a surface of the first inner surface or second inner surface and is exposed at an edge of one of the first and second layers to allow electrical communication with the electrical component.

In some embodiments, the electrical component comprises an optoelectronic component for generating and/or detecting an optical signal. The method may further comprise providing an optical element for manipulating the optical signal. The optical element may be provided between the first and second layers before attaching the first and second layers together. The sealed portion may be configured to prevent liquid ingress between the first and second layers towards the optical element.

In some embodiments, the method comprises providing adhesive on at least one of the first and second layers for at least one of: attaching the first and second layers together; and/or adhering the electrical component to at least one of the first and second layers.

In some embodiments, at least one of the first and second layers comprise a shape-adaptable portion. The method may comprise applying a force to the device to cause the device to adopt a specified shape.

In some embodiments, the method comprises distributing the electrical component and at least one other component between the first and second layers in such a way that a substantially continuous flexibility is provided along the device created by attaching the first and second layers together.

In some embodiments, at least one of the first and second layers comprises a surface of an appliance. The method may comprise attaching the other of the first and second layers to the surface of the appliance to create the device.

According to a second aspect, a device is provided. The device comprises a first layer defining a first inner surface and a first outer surface. The device further comprises a second layer defining a second inner surface and a second outer surface. The first outer surface and the second outer surface define an external surface of the device. The device further comprises an electrical component positioned between the first and second layers. The device further comprises an electrical connection, for the electrical component, positioned between the first and second layers. The electrical connection is printed on the first layer or the second layer. The electrical component and the electrical connection are in contact with both the first inner surface and the second inner surface. The first and second layers are attached together to form a sealed portion defined by liquid-tight attachment between the first and second inner surfaces around the electrical connection. In use of the device, the sealed portion prevents liquid ingress into the device along the electrical connection between the first and second layers towards the electrical component. The electrical connection is configured to allow electrical communication with the electrical component via the sealed portion. An edge of the first layer is offset from an edge of the second layers such that a portion of the electrical connection printed on the first layer or the second layer is exposed for connecting to an electrical power supply.

Some embodiments relating to the second aspects are described below.

In some embodiments, the electrical component comprises an optoelectronic component for generating and/or detecting an optical signal.

In some embodiments, the device comprises an optical element for manipulating the optical signal.

In some embodiments, at least one of the first and second layers comprises a transparent portion for allowing transmission of the optical signal through at least one of the first and second layers.

These and other aspects of the invention will be apparent from and elucidated with reference to the embodiment(s) described hereinafter.

BRIEF DESCRIPTION OF THE DRAWINGS

Exemplary embodiments of the invention will now be described, by way of example only, with reference to the following drawings, in which:

FIG. 3b is a side view of the device of FIG. 3a in the direction A-A indicated in FIG. 3a;

DETAILED DESCRIPTION OF THE EMBODIMENTS

Figure 1:
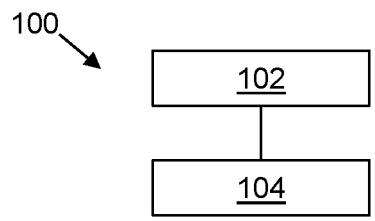
FIG. 1 refers to a method of manufacturing a device according to an embodiment.

FIG. 1 shows a method 100, which may be a method of manufacturing a device such as described below. The method 100 comprises, at block 102, providing a first layer, a second layer and an (e.g., at least one) electrical component between the first and second layers. The first layer defines a first inner surface and a first outer surface. The second layer defines a second inner surface and a second outer surface. The electrical component is positioned on the first inner surface or the second inner surface.

The manner by which the first layer, second layer and electrical component are provided may depend on the situation or purpose of the device and/or the nature of the first layer, second layer and/or electrical component.

For example, the first layer may be provided (e.g., at a particular location) and then the second layer may be provided (e.g., at or near that particular location) such that the electrical component is located between the first and second layers before proceeding to the next block of the method 100.

The electrical component may be provided at an appropriate time between the first and second layers by positioning the electrical component at an appropriate location on, adjacent to or within (e.g., embedded or otherwise incorporated within) the first layer or second layer.

In an example, the electrical component may be provided in situ where the first layer and second layer are provided (e.g., as part of block 102) before the method 100 proceeds to the next block of the method 100. For example, the first layer may be provided before providing the electrical component, which may be positioned on the first layer (i.e., the first inner surface) before providing the second layer.

In another example, the first layer or second layer may already include the electrical component. For example, the electrical component may be attached to, integrated within or otherwise provided as part of one of the first and second layers (e.g., if this layer is manufactured at a different site).

The term "layer" is not intended to be limiting to any particular dimension or cross-sectional aspect ratio for that layer. For example, both of the first and second layers may be relatively thin such that their combined thickness is of order a millimeter or below a millimeter. In another example, one of the first and second layers may be relatively thin (e.g., with a thickness of order of a hundred microns, several hundred microns, or below a millimeter) while the other of the first and second layers may be relatively thicker (e.g., with a thickness of greater than a millimeter). In another example, both of the first and second layers may be relatively thick such that their combined thickness is greater than a millimeter such as several millimeters.

Further, the term "layer" is not intended to be limiting to a single entity by itself. For example, a layer may refer to part of (e.g., a surface of) a larger entity such as a consumer appliance (e.g., a shaver unit, toothbrush unit or the like).

The method 100 further comprises, at block 104, attaching the first and second layers together to create a device comprising the first and second layers. The first outer surface and second outer surface define an external surface of the device. The device further comprises a sealed portion defined by liquid-tight attachment between the first and second inner surfaces, to prevent liquid ingress into the device between the first and second layers towards the electrical component.

Since the electrical component is between the first and second layers, by attaching the first and second layers together, the electrical component (and any other components) may be at least partially or fully sealed within the device. The sealed portion of the device may be such that liquid such as water is prevented from penetrating between the first and second layers if the device contacts or is immersed in the liquid. The electrical component (and any other components) between the first and second layers may be protected from the liquid so that the electrical component (and any other components) may continue to function as intended even if the device has come into contact with or is in contact with liquid. The method 100 may be used to create a device which is relatively compact, for example, due to the relatively straightforward and/or efficient manufacturing process for creating the device (i.e., a single step of attaching the first and second layers together to form the sealed portion). The device created by the method 100 may be intrinsically fluid-tight, robust and/or relatively compact due to the relatively straightforward and/or efficient manufacturing process. For example, as compared to an example manufacturing process which initially creates a device and then attempts to seal the device by some separate process, the present method 100 simultaneously creates (e.g., assembles) the device and seals the electrical component within the device at the same time.

Attaching can be achieved by, for example: providing adhesive on one or both of the first and second layers and then placing the layers together to allow the layers to become attached; bonding the layers together by applying heat to one or both of the layers; causing diffusion of material in one of the layers to another of the layers to thereby attach the first and second layers together; or otherwise causing attachment of the first and second layers together.

Accordingly, the method 100 may be used to manufacture the device in a single-process set up (e.g., with multiple sheet-to-sheet or roll-to-roll production steps at one single production line) to create an intrinsic liquid-tight device such as may be applied in water-robust handheld appliances. In some cases, the device may be formed as a thin film mechatronic laminate. Water-robust handheld appliances such as shaver units may have limited electrical power, occupy a small volume and/or have strong curvatures in certain components used in the assembly of the appliance (which may mean that the device needs to be bent to fit within the assembly). Since such handheld appliances may, in use, be exposed to water, the components used in the device may need to be intrinsically water-tight to meet specification. As mentioned above, the method 100 may facilitate the manufacture of a device that meets a certain specification, for example, as specified for water-robust handheld appliances.

As will be discussed in more detail below, other components in addition to the electrical component may be included in the device. For example, optoelectronic/optical components and/or mechanical components may be provided between the first and second layers and sealed therebetween. Accordingly, the end device may meet a certain specification in terms of flexibility, robustness, thickness, liquid-tightness and the like while the end device contains the electrical component(s), mechanical component(s) and/or optical component(s) for the specified application. Further, the end device may be provided in a specified shape, for example, to be applied in e.g. a shaver unit.

Figure 2:
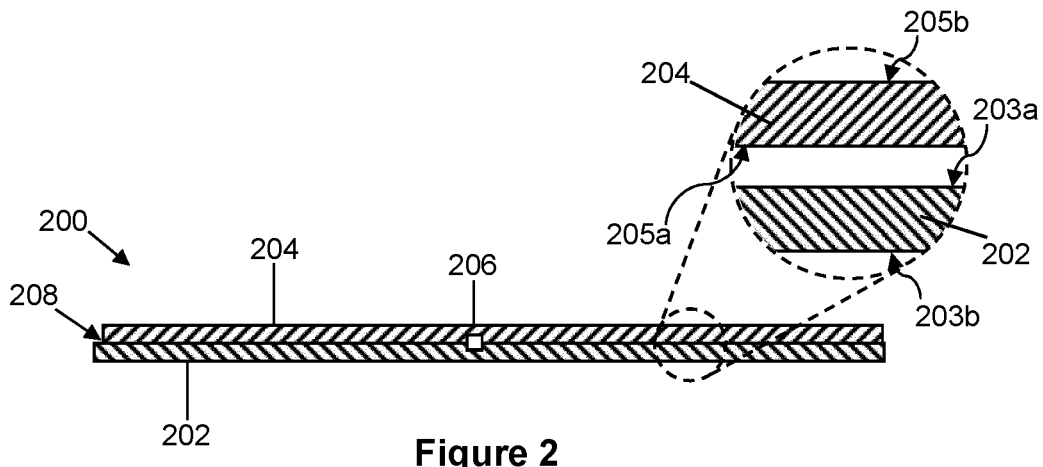
FIG. 2 is a schematic drawing of a device, including an expanded view of part of the device, according to an embodiment.

FIG. 2 shows a device 200 manufactured in accordance with the method 100 of FIG. 1. The device 200 comprises a first layer 202 comprising a first inner surface 203a and a first outer surface 203b, a second layer 204 defining a second inner surface 205a and a second outer surface 205b and an electrical component 206 between the first and second layers 202, 204. FIG. 2 includes an expanded view of part of the device 200 where the separation between the first and second layers 202, 204 is exaggerated to more clearly show the respective surfaces. In this embodiment, the first and second layers 202, 204 are in contact with each other, or at least in close proximity to each other. The first outer surface 203b and the second outer surface 205b define an external surface of the device 200. The first and second layers 202, 204 are attached together (i.e., as part of a method of manufacture such as described by method 100). Prior to attachment, the electrical component 206 is positioned on, or otherwise embedded in or attached to, the first inner surface 203a or the second inner surface 205a (i.e., either positioned on the first inner surface 203a or the second inner surface 205a before the first and second layers 202, 204 are attached together). The first and second layers 202, 204 are attached together to form a sealed portion 208 defined by liquid-tight attachment between the first and second inner surfaces 203a, 205a. In use of the device 200, the sealed portion 208 prevents liquid ingress into the device 200 between the first and second layers 202, 204 towards the electrical component 206. In this embodiment, the first and second layers 202, 204 completely surround the electrical component 206 such that the sealed portion 208 extends all the way around the electrical component 206. Liquid ingress between the first and second layers 202, 204 towards the electrical component 206 may thus be prevented. Further details of embodiments of the device 200 are described in more detail below.

FIGS. 3a to 3d show various views of a device 300 being manufactured in accordance with certain methods described herein (such as method 100 or method 600 described below). The device 300 is similar to device 200 of FIG. 2 but shows additional details of the device 200. Reference signs for features of the device 300 which correspond to similar features of the device 200 are incremented by 100 as compared to FIG. 2.

Figure 3A:
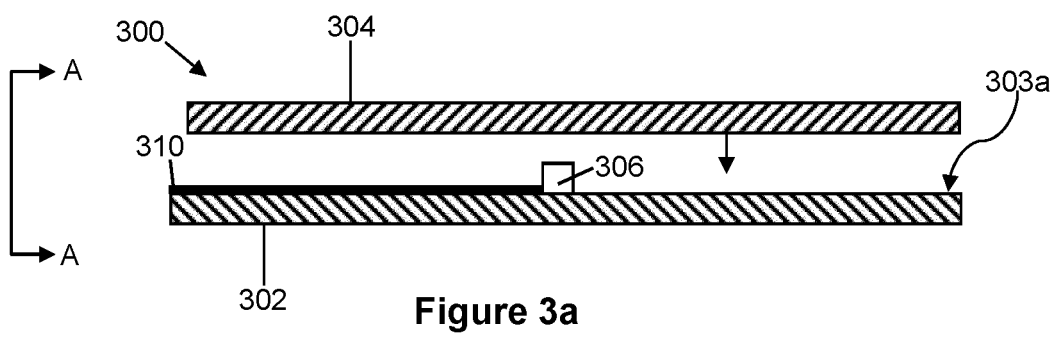
FIG. 3a is a schematic cross-section of a device according to an embodiment during manufacture thereof.
Figure 3B:
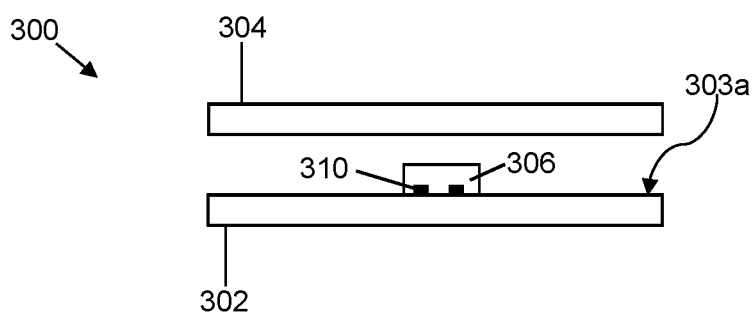
Figure 3C:
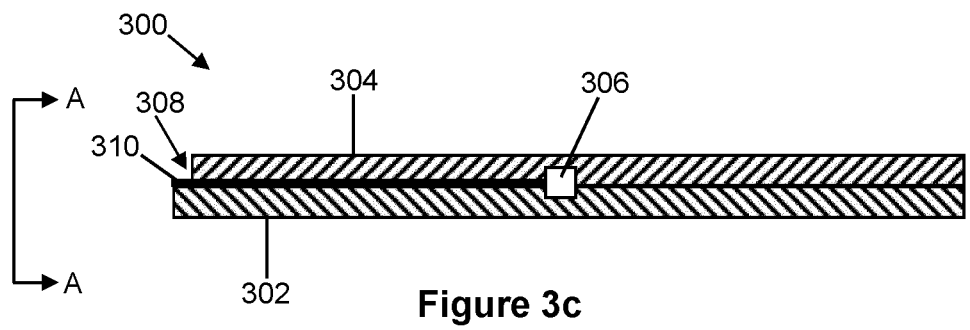
FIG. 3c is a schematic cross-section of the device of FIG. 3b after manufacture thereof.
Figure 3D:
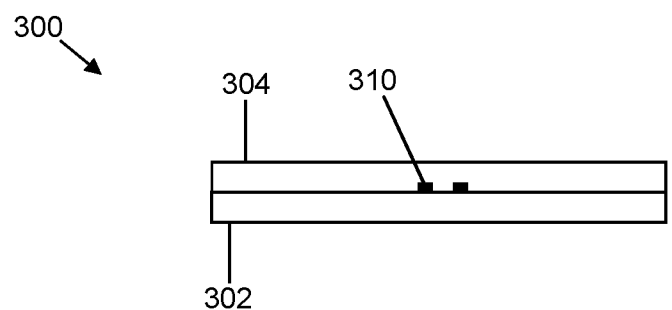
FIG. 3d is a side view of the device of FIG. 3c in the direction A-A indicated in FIG. 3c.

In FIGS. 3a to 3b, the device 300 is depicted in its pre-manufactured form (i.e., at block 102 of the method 100) where the first layer 302, second layer 304 and the electrical component 306 have been provided. In FIGS. 3c to 3d, the device is depicted in its manufactured form (i.e., at block 104 of the method 100) where the first and second layers 302, 304 have been attached together. FIGS. 3b and 3d are side views of the device 300 as indicated by the direction A-A in FIGS. 3a and 3c.

Additionally, an electrical connection 310 is provided between the first and second layers 302, 304. The electrical connection 310 is configured to allow electrical communication with the electrical component 306 via the sealed portion 308 as shown in FIG. 3c. In this embodiment, the electrical connection 310 comprises two electrical connections 310, as depicted by the side view of FIGS. 3b and 3d, which are provided on the inner surface 303a of the first layer 302. Although two electrical connections 310 are shown, a different number of electrical connections 310 may be provided, depending on the circuitry needed for allowing electrical communication with the specified type of electrical component 306.

In an embodiment, the electrical connections 310 comprise printed circuitry (e.g., a metal such as silver printed on the surface of the first layer 302). In an example, as part of certain methods described herein, the first layer 302 may be provided in situ and then the electrical connections 310 may be printed on the first layer 302 before attaching the second layer 304 to the first layer 302. In another example, as part of certain methods described herein, the electrical connections 310 may be printed on the first layer 302 in another manufacturing site and then the first layer 302 (including the printed electrical connections 310) and the second layer 304 may be provided and then attached together.

As can be seen from FIGS. 3a and 3c, the first and second layers 302, 304 are configured such that at least a portion of the electrical connection 310 is exposed between the first and second layers to allow electrical communication with the electrical component 306. In this embodiment, the first and second layers 302, 304 are offset such that when the first and second layers 302, 304 are attached together, a portion of the electrical connections 310 is exposed while still ensuring that the sealed portion 308 (e.g., defined by contact between the first and second layers 302, 304 around the electrical connections 310) prevents liquid ingress between the first and second layers 302, 304 and/or along the electrical connections 310 between the first and second layers 302, 304. In this embodiment, the electrical connections 310 extend along the first inner surface 303a (i.e., where these layers 302, 304 are facing each other) and the electrical connections 310 are exposed at an edge of the second layer 304 to allow electrical communication with the electrical component 306.

As can be seen from FIGS. 3b and 3d, the first and second layers 302, 304 completely surround the electrical component 306 between the first and second layers 302, 304. Further, the first and second layers 302, 304 surround the electrical connections 310 between the first and second layers 302, 304 while the offset between the edges of the first and second layers 302, 304 ensures that at least a portion of the electrical connections 310 is exposed to allow electrical communication with the electrical component 306 via the sealed portion 308.

The exposed electrical connection 310 may need to be sealed in a liquid-tight body (e.g., by an over-molding process or a heat lamination process) via a separate process to make the electrical connection to a controller (not shown, which may be the part of the appliance for supplying electrical power to the electrical component 306) external to the device 300. Nonetheless, even if this separate process does not adequately seal the exposed electrical connection 310, the attachment of the first and second layers 302, 304 may be sufficient to prevent ingress of liquid towards the electrical component 306 between the first and second layers 302, 304.

The method illustrated by FIGS. 3a-3d and other methods described herein may be used to create a device with a relatively compact volume and/or thickness as compared to devices created by certain other manufacturing processes. Such a device may be relatively compact for use in assembling an appliance. For example, the device may be configured as a light ring or functional device or laminate in such an appliance. A light ring may produce light to provide information such as battery charge level, power on/off status and/or to provide illumination for a user of the appliance. In some examples, a functional device or laminate may perform some function such as detecting a user input (e.g., if the electrical component comprises a sensor such as a touch sensor), which may be used to control the appliance and/or sense some other input from the environment such as temperature, humidity, or the like. In some examples, the functional device or laminate may comprise a communication device (e.g., configured for Bluetooth, WiFi, Near Field Communication (NFC), optical, cellular (4G, 5G, etc) communication, or the like).

Figure 4:
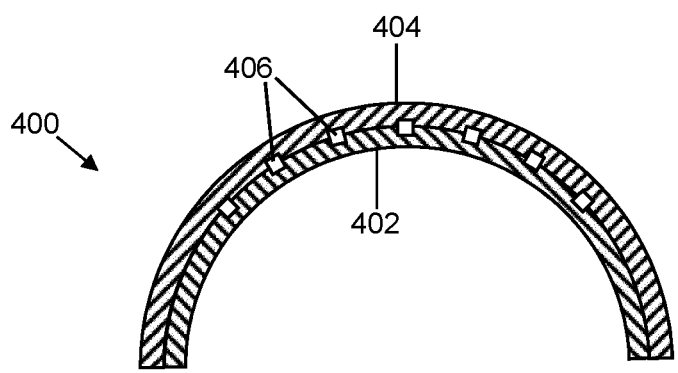
FIG. 4 is a schematic cross-section of a device according to an embodiment.

FIG. 4 shows another device 400 manufactured in accordance with certain methods described herein (such as method 100 or method 700 described below). The device 400 is similar to device 300 of FIG. 3 but shows certain other features. Reference signs for features of the device 400 which correspond to similar features of the device 300 are incremented by 100 as compared to FIG. 3.

In this embodiment, the device 400 is manufactured in a similar way to that depicted by FIGS. 3a to 3d whereby the first and second layers 402, 404 are initially provided in a planar form and then attached together to form the device 400. At least one of the first and second layers 402, 404 comprise a shape-adaptable portion. The shape-adaptable portion may be: flexible, stretchable, compressible and/or elastic. In other similar words, the shape-adaptable portion may have any appropriate mechanical property for allowing the portion (and/or the layer) to change its shape or form. For example, the shape-adaptable portion of the first and/or second layers 402, 404 may comprise a material such as a flexible polymer and/or be otherwise constructed such that the shape-adaptable portion is less stiff (or, in other words, more flexible or stretchable) than another portion of the device 400. In this embodiment, both of the first and second layers 402, 404 are made of polymer and are flexible throughout. The polymer may be resistant to liquid (e.g., water-tight) such that liquid may be prevented from penetrating through the layer 402, 404.

A force may be applied to the device 400 to cause the device 400 to adopt a specified shape, for example, an arcuate shape as shown by FIG. 4 or a ring-like shape (not shown). The device 400 may retain its intrinsically fluid-tight and robust structure even though the device 400 has been flexed as shown. The ability for the device 400 to adopt a specified shape may allow the device 400 to be readily incorporated with an appliance in a specified manner. For example, an appliance such as a shaver unit (not shown) may have various contours and the device 400 may be flexed to adopt a specified shape which matches the contours of the appliance when incorporated (e.g., embedded into a slot in) the appliance.

The device 400 comprises an electrical component 406 and at least one other component 406. The other components may or may not be electrical components and there may be different numbers of components (e.g., two or more). In an example, at least one other component 406 may comprise an optical element such as a waveguide, lens, prism, reflector, diffuser, optically transparent portion, optically opaque portion, or the like. In another example, at least one other component 406 may comprise a structural component for providing certain mechanical properties such as stiffness, flexibility, or the like at the location where the component is provided between the first and second layers 402, 404.

In this embodiment, the electrical component 406 and the other components 406 are distributed between the first and second layers in such a way that a substantially continuous flexibility (or in other words, a substantially continuous stiffness) is provided along (e.g., along a length or width of) the device 400 created by attaching the first and second layers 402, 404 together. As can be seen from FIG. 4, the components 406 are evenly spaced apart between the first and second layers 402, 404 and are of a similar size such that the device 400 can adopt a shape with a constant bending radius as depicted by FIG. 4. This even spacing of the components 406 and/or ensuring a continuous flexibility is provided along the device 400 may reduce stress peaks at certain locations of the device 400 when the device is flexed to form a specified shape (which may otherwise cause delamination of the layers 402, 404 at those locations) and may also minimize the volume needed for assembling the device 400.

Any components which are rigid may cause local stiffness within a device 400 which otherwise comprises a stretchable and/or flexible layer. Such local stiffness may cause difficulties in allowing the device 400 to adopt certain shapes. By appropriately distributing the components 406 within the device 400, the flexibility along the device 400 (e.g., between the components) may be substantially the same along the device 400. In other words, the flexibility may be substantially continuous along the length or width of the device 400 apart from where any rigid components interfere with this flexibility and introduce local stiffness. Further, the distribution of the components may be such as to minimize areas of high stress concentrations between the layers when bending the device 400. For example, distributing the components 406 apart from each other may minimize stress at the location of the components 406 (in contrast to a scenario where the components are adjacent to each other). Such even distribution of the components 406 may reduce the likelihood of delamination (e.g., instantly upon bending or over time) which may affect the quality of the seal provided by the two layers 402, 404.

As depicted by FIG. 4, the device 400 may comprise evenly distributed components 406 throughout the device 400. The device 400 may be evenly filled with components 406 to reduce the possibility of gaps or air pockets between the components causing certain problems with the device 400. For example, delamination of the layers 402, 404 may be caused by expanding air pockets in the device 400 (e.g., under a varying (thermal) load case). Reducing the number and/or size of such spaces or air pockets by evenly distributing the components 406 within the device 400 may reduce the risk of the integrity of the device 400 being compromised. Where an over-molding process such as injection molding is applied to the device 400 (e.g., to integrate the device 400 with an appliance), the molding process may apply pressure and/or heat which may compress the device 400 in regions where such spaces or air pockets exist in the device 400. Again, minimizing the number and/or size of such spaces or air pockets may avoid local compression of the device 400, which may otherwise adversely affect the expected functionality of the device 400. In some examples, gaps or air pockets may be minimized or eliminated by using a vacuum-based lamination technique. In this case, at least one of the first and second layers 402, 404 may conform to the shape of the other layer and/or any components 406 between the layers 402, 404.

Different components 406 may be of certain sizes and/or have certain mechanical properties which may affect how the device 400 responds when flexed in certain ways. Accordingly, additional components (not shown) may be provided between the first and second layers 402, 404 to provide certain mechanical properties at certain locations between the first and second layers 402, 404 in order to provide a specified flexibility, stretchiness or stiffness along the device 400. In some cases, a non-continuous flexibility or stiffness may be provided along the device 400 due to the mechanical properties of the components 406 between the first and second layers 402, 404 and/or due to the mechanical properties of the at least one of the first and second layers 402, 404.

As can be seen in FIG. 4, certain methods described herein may be used to create a device 400 with relatively increased geometrical flexibility as compared to devices created by certain other manufacturing processes (e.g., involving multiple production steps at different sites). For example, the flexibility of the device 400 of FIG. 4 may allow a three-dimensional light ring or other functional device to be created by initially manufacturing the device 400 in a substantially two-dimensional geometry and then shaping the device 400 to form a three-dimensional geometry. This device 400 may then be applied to or otherwise combined with an appliance (not shown) such as a handheld appliance where a specified three-dimensional shape is specified in order to appropriately apply or otherwise combine the device 400 with the appliance.

Further, certain methods described herein may provide for efficient production of a three-dimensional (3D) device. As highlighted by FIGS. 3 to 4, the device may be manufactured with a two-dimensional (2D) geometry and then shaped to form a specified 3D geometry. For example, a 2D manufacturing process such as sheet-to-sheet or roll-to-roll assembly line may be used to create the 2D device and then the 2D device may be adapted into a 3D assembly part-by-part directly in an appliance, which may avoid needing to use more complex three-dimensional production processes such as complex 3D lamination or 3D sealing by assembly.

Although FIG. 4 depicts the device 400 as being constructed of two flexible layers 402, 404, there may be other device configurations where at least one of the layers is not flexible and/or the device 400 is constructed in a different manner with certain features providing flexibility where the layers 402, 404 do not provide such flexibility.

For example, at least one of the layers 402, 404 may be stretchable or compressible (e.g., at least in a direction along a length or width of the layer). At least one of layers may comprise a foil which may include ink (e.g., for providing patterning in or on the layer). Such a layer may be stretchable so that the ink does not crack or otherwise deform when stretched or compressed. In an example, if polyethylene terephthalate (PET) and/or polyethylene naphthalate (PEN) is used for one or both of the layers 402, 404, the combination may be relatively rigid. However, a core (e.g., comprising the components 406) between the two layers 402, 404 may be flexible such that the overall device 400 may be relatively flexible. There may be scenarios where bending of such a device 400 may cause delamination and/or breakage of certain parts. A layer of the device 400 may be relatively non-stretchable or incompressible along its length or width (yet is still flexible) such that, during bending, the layer has the smallest bending radius (and no stretching) of the various layers of the device. In some cases, a layer that is relatively non-stretchable or incompressible may be used for supporting any rigid components (e.g., surface-mount devices (SMD) such as certain electronic components) to reduce the risk of damaging or dislodging the component due to minimized stretching or compressing of that layer during bending of the device 400.

Figure 5:
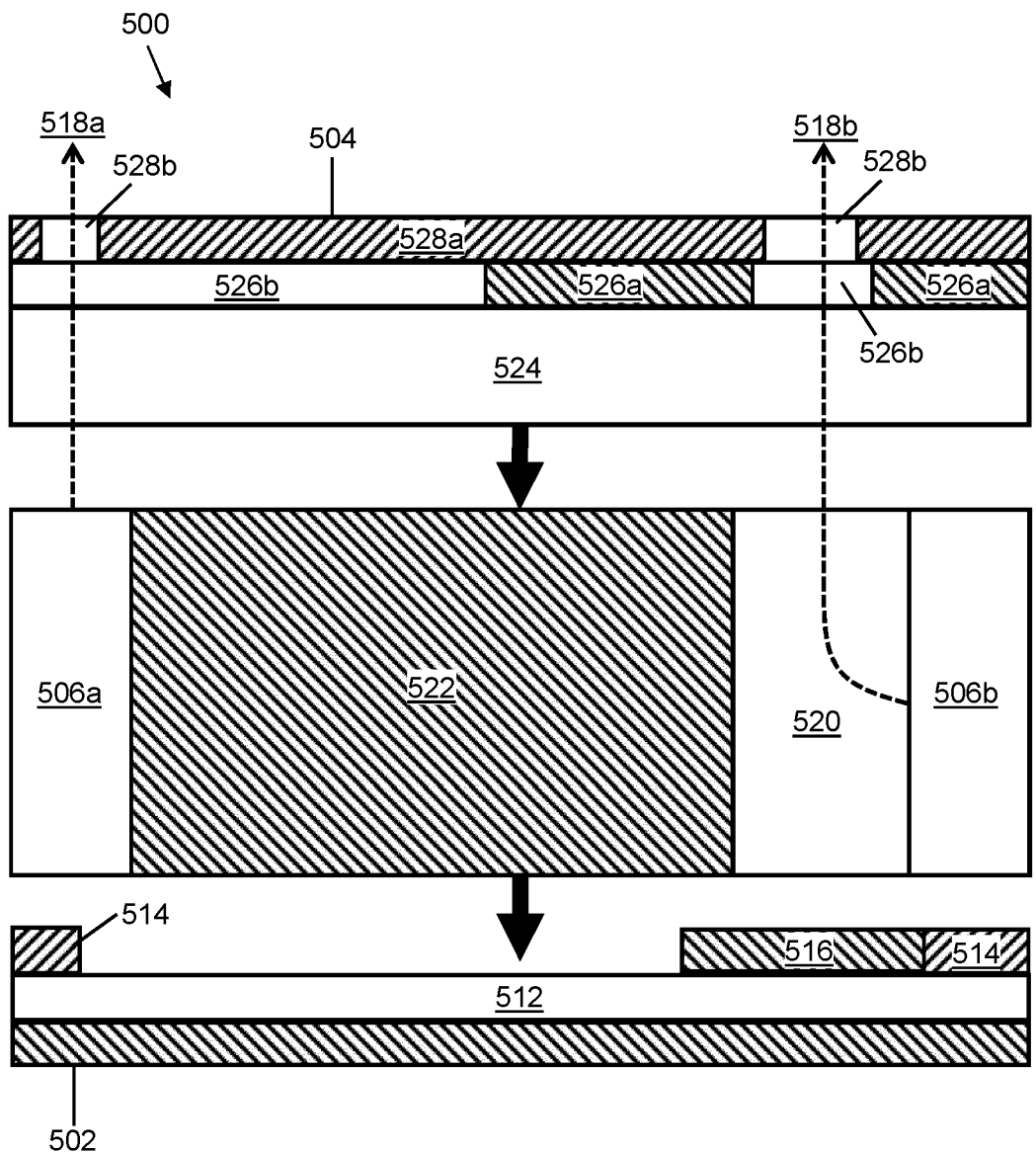
FIG. 5 is a schematic cross-section of a device according to an embodiment.

FIG. 5 shows an exploded view of another device 500 manufactured in accordance with certain methods described herein (such as method 100 or method 600 described below). The device 500 is similar to device 400 of FIG. 4 but shows certain other features. Reference signs for features of the device 500 which correspond to similar features of the device 400 are incremented by 100 as compared to FIG. 4.

As before, the device 500 comprises a first layer 502 and a second layer 504. The structure of the first and second layers 502, 504 is described in more detail below. Various components are provided between the first and second layers 502, 504. In this embodiment, these components are provided on the first layer 502 and then the second layer 504 is attached to the first layer 502. The point of attachment of the first and second layers 502, 504 is not shown for brevity in FIG. 5 since this is already shown in the previous figures. Instead, FIG. 5 is an expanded view of the structure of the components and the first and second layers 502, 504. The first and second layers 502, 504 may be constructed in situ where the device 500 is manufactured or at least one of the first and second layers 502, 504 may be manufactured elsewhere and then provided in situ where the device 500 is manufactured. The process for manufacturing the device 500 from bottom layer to the top layer (i.e., the first layer 502 to the second layer 504) is now described.

The first layer 502 comprises a polymer layer which, in this embodiment, comprises thermoplastic polyurethane (TPU). TPU may be optically transparent to certain wavelengths or may opaque to certain wavelengths (e.g., TPU white or black). In this case, the first layer 502 comprises TPU white but in other cases could comprise a different color such as black (e.g., to avoid light penetration or leakage). In some other embodiments, the first layer 502 may comprise a relatively non-stretching material such as PEN, PET, polyimide (PI), or the like. Certain SMD components may be better supported on the first layer 502 if the first layer 502 is relatively non-stretching since, in some scenarios, TPU may be too stretchable for some SMD-type components. The first layer 502 of this embodiment may be used to support components and electrical conductors such as tracks and may, depending on its color, be used for blocking light from penetrating therethrough.

Circuitry 512 (e.g., silver and/or another appropriate conductive material) is then printed on the first layer 502. The circuitry comprises the electrical connection referred to in FIGS. 2 to 3 and provides electrical communication for any electrical components in the device 500. In some cases, electrical components (e.g., resistors, inductors, capacitors, microprocessors, or the like) other than electrical connections may be provided and/or printed as part of the circuitry 512.

A conductive adhesive such as isotropic conductive adhesive (ICA) 514 is deposited at certain locations on the circuitry 512. This provides part of the electrical connection to certain electrical components of the device 500. In this embodiment, a polymer portion 516 (e.g., TPU white) is provided (e.g., by printing, molding or otherwise depositing the polymer portion 516) on the circuitry 516. The polymer portion 516 may provide certain functionality such as providing certain mechanical properties (e.g., support for other components and/or certain stiffness or flexibility) at that location of the device 500. In this embodiment, the polymer portion 516 is optically opaque (e.g., to prevent light from escaping an adjacent component of the device 500 described below).

In this embodiment, the first layer 502 (including the various components described above) is approximately 0.3 mm thick although other thicknesses are possible (such as less than or more than 0.3 mm). For ease of reference, the combination of the first layer 502, the circuitry 512, ICAs 514 and polymer portion 516 shall simply be referred to as the first layer 502 below.

Various components are provided on the first layer 502. First and second electrical components 506a,b are positioned on the ICAs 514. In this embodiment, the electrical components 506a,b each comprise an optoelectronic component in the form of a light emitting diode (LED). The LEDs produce an optical signal which is emitted from the device 500 as will be described in more detail below.

The first electrical component 506a (LED) emits an optical signal 518a in a vertical direction (i.e., towards the second layer 504).

The second electrical component 506b (LED) emits an optical signal 518b in a horizontal direction (i.e., in a plane parallel to the first and second layers 502, 504). An optical element 520 is provided for manipulating the optical signal 518b. The optical element 520 is located adjacent to the second electrical component 506b and is optically coupled to the second electrical component 506b. In this embodiment, the optical element 520 comprises an optical waveguide that directs the optical signal emitted by the second electrical component 506 along the optical waveguide. In use of the device 500, the optical signal 518b propagates along the optical waveguide. The optical element 520 may be configured such that the optical signal 518b changes direction and propagates towards the second layer 504. For example, the optical element 520 may comprise at least one reflective structure such as for changing the direction of the optical signal 518b.

An additional polymer portion 522 (e.g., the portion 522 may comprise a single TPU white or TPU dense white portion, or may comprise multiple layers such as a white layer combined with a (e.g., printed) black layer for blocking light from neighboring optical elements 520) is provided between the first electrical component 506a and the optical element 520. As with the polymer portion 516, the additional polymer portion 522 may provide certain functionality such as providing certain mechanical properties (e.g., support for other components and/or certain stiffness or flexibility) at that location of the device 500. In this embodiment, the additional polymer portion 522 is optically opaque (e.g., to prevent light from escaping from the optical element 520 and/or reflecting the optical signal 518b within the optical element 520). The additional polymer portion 522 may be provided by, for example, being formed (e.g., solidified) and positioned at its location, layered, or by being molded in situ, or the like. As mentioned above, a black layer may be provided as part of the additional polymer portion 522 (e.g., extending all the way across the top of the core/layer shown in FIG. 5 comprising the electrical components 506). This black layer may comprise openings such that light from the first and second electrical components 506a, 506b can exit this core/layer and then escape from the second layer 504, as described in more detail below.

In some embodiments, the various components described above including the electrical components 506a,b, optical element 520 and the additional polymer portion 522 may be provided as a layer in itself (e.g., with these various components integrated within the layer). In this embodiment, the thickness of these various components is approximately 0.7 mm although other thicknesses are possible (such as less than or more than 0.7 mm).

After the various components described above have been provided, additional components may be provided. In this embodiment, an additional optical element in the form of a diffuser layer 524 (e.g., an optical diffuser) is provided on top of the components described above. The diffuser layer 524 may diffuse the optical signals 518a,b to provide a more uniform distribution of the illumination compared with the direct illumination provided by an LED by itself. First and second additional polymer layers 526, 528 (e.g., comprising TPU white, TPU black, optically transparent TPU and/or ink) are provided on the diffuser layer 526. In this embodiment, the first additional polymer layer 526 comprises TPU white portions 526a and transparent portions 526b. The second additional polymer layer 528 comprises TPU black portions 528a and transparent portions 528b. The transparent portions 526b, 528b are aligned relative to the first electrical component 506a and optical element 520 such that the optical signals 518a,b may pass through the transparent portions 526b, 528b and out of the device 500. Although certain components are described as having a certain color (e.g., black or white), other colors may be used where appropriate (e.g. for aesthetic considerations and/or for functional considerations such as absorbing or reflecting light).

In this embodiment, the diffuser layer 526 and first and second additional polymer layers 526, 528 may be regarded as the 'second layer 504'. However, in some embodiments, the second additional polymer layer 528 may be regarded as the 'second layer 504' and in other embodiments, the combination of the first and second additional polymer layers 526, 528 may be regarded as the 'second layer 504'. In this embodiment, the second layer 504 is approximately 0.1 mm thick although other thicknesses are possible (such as less than or more than 0.1 mm).

Accordingly, any of the layers 502, 504 may comprise at least one layer. Thus, the device 500 may be regarded as comprising at least two layers. The overall thickness of the device 500 may be of order 1 mm although other thickness are possible (such as less than or more than 1 mm).

It is mentioned above that certain layers comprise polymer and certain components (or layers comprising such components) may comprise various materials such as metal, plastic, etc. In some cases, a functional printed layer of the device 500 may be dominantly metal, polymer or ceramic in a dry state.

In some embodiments, the device 500 may be intrinsically liquid-tight (e.g., water-tight) due to the first and second layers 502, 504 being attached together (not shown in FIG. 5 but shown in FIGS. 2 to 3) such that the device 500 can potentially be submerged in water (or any other electrically conducting liquid) without causing malfunctioning of the device 500 (e.g., due to an electrical short circuit or optical performance loss). Providing the circuitry 512 of the device 500 is sealed by attaching the first and second layers 502, 504 together (e.g., see FIGS. 3 to 4), water ingress may be prevented. Such intrinsic liquid-tightness may useful for an appliance such as a shaver unit which, in use, may be rinsed under running water.

Various components may be sealed within the device 500 during the manufacturing process in accordance with certain methods described herein. For example, a light guide, a sensor and/or (e.g., solid-state) actuator (e.g., touch sensor) may be provided to perform certain functions in an appliance such as a shaver unit like touch controls and user feedback control (e.g., by resonance at remote positions from the surface/main board of the appliance).

The relatively straightforward manufacturing process may facilitate accurate alignment of components such as LEDs and optical elements in the device 500 by placing them in the device 500 in one production setup, which may ensure appropriate alignment of such components and therefore may reduce or avoid losses in terms of electrical-to-optical signal conversion efficiency within the device 500.

As noted above, various types of optical element 520 may be integrated within device 500 during manufacture thereof. Certain optical elements 520 such as prisms (which may be used to homogenize the optical signal 518b output by the device 500) may be relatively bulky and/or difficult to integrate using certain manufacturing processes. The same may apply to any of the other types of optical elements described herein such as a waveguides, lenses, and reflectors. However, certain methods described herein may facilitate the integration of such optical elements 520 and other components in the device 500.

Although not shown in FIG. 5, a refractive index matching adhesive may be provided in any spaces between the components through which the optical signal 518a,b propagates. Such index-matching adhesive may avoid or reduce optical losses and/or improve homogeneity of the optical signal output by the device 500.

Certain components of the device 500 may create certain illuminated compartments within the device 500 which are surrounded by components for preventing any unintended escape of the optical signal 518a,b (e.g., due to use of opaque components within the device 500). Such opaque components (e.g., the additional polymer portion 522) may be used avoid cross talk between the different optical signals 518a,b. These opaque components may be relatively straightforward to install in the device 500 while also being relatively effective in terms of avoiding optical losses.

Devices described herein may be integrated in an appliance as a 2D-shaped device or as a 3D-shaped device. In some cases, it may be possible to thermoform, back mold and/or over mold such devices with a polymer (e.g., adhesive and/or sealant) to create a solid integrated structure (e.g., within an enclosure of the appliance) comprising the appliance and the device integrated with the appliance. In an example, a plate (e.g., 'layer') of polycarbonate or polymethyl methacrylate (PMMA) may be thermoformed in the presence of the device 500. In a further example, the thermoformed device combination may be molded to create the solid integrated structure mentioned above.

Figure 6:
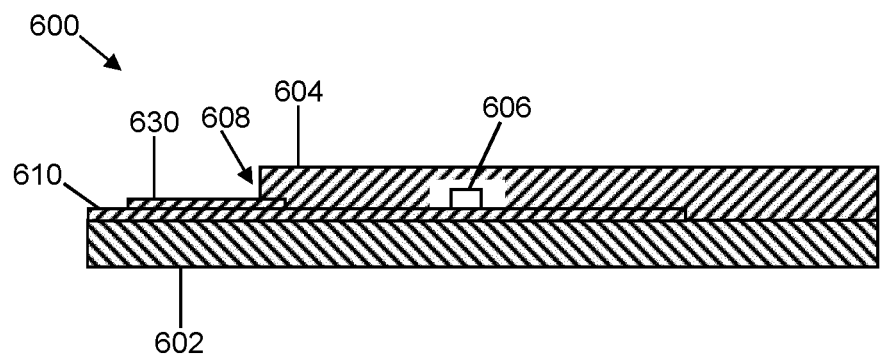
FIG. 6 is a schematic cross-section of a device according to an embodiment.

FIG. 6 depicts another device 600 with a similar form to the device 300 as shown by FIG. 3c. Similar to the device 300, the device 600 comprises first and second layers 602, 604, an electrical component 606, a sealed portion 608 and electrical connection 610. Additionally, the device 600 comprises an isolating portion 630 provided on part of the electrical connection 610 and extending partway into the sealed portion 608 of the device 600 between the first and second layers 602, 604. The isolating portion 630 also extends partway along the electrical connection 610 (where the second layer 604 is not provided) such that part of the electrical connection 610 is exposed as described above. In other similar words, the first and second layers 602, 604 are still configured such that at least a portion of the electrical connection 610 is exposed between the first and second layers 602, 604 to allow electrical communication with the electrical component 606. However, the isolating portion 630 may provide additional protection from liquid ingress between the first and second layers 602, 604 since the electrical connection 610 itself is protected (e.g., isolated) at the edge of the second layer 604 offset from the first layer 602.

The isolating portion 630 may comprise a polymer (e.g., bulk or printed) and/or another material to isolate the electrical connection 610 underneath from liquid contact. The isolating portion 630 may be relatively thin compared with the second layer 604 such that the combination of the first layer 602, electrical connection 610 and the isolating portion 630 may be relatively thinner than the combined thickness of the first and second layers 602, 604 (as shown by FIG. 6). This relatively thinner part of the device 600 may be referred to as a connecting 'tail' since this part may be installed at, for example, a power supply of an appliance.

Figure 7:
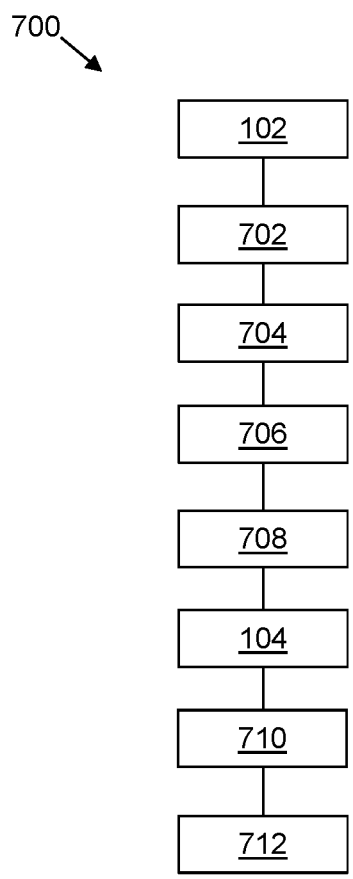
FIG. 7 refers to a method of manufacturing a device according to an embodiment.

FIG. 7 refers to a method 700 of manufacturing a device in accordance with certain embodiments described above. The method 700 may comprise at least one of the blocks 102, 104 of the method 100 of FIG. 1 and reference is also made to these blocks of the method 100 for ease. Certain blocks may be omitted from the method 700, where appropriate. Further, the sequence of the blocks may be changed in some cases.

In some embodiments, the method 700 comprises, at block 702, providing an electrical connection on one of the first and second layers before attaching the first and second layers together. The electrical connection may be configured to allow electrical communication with the electrical component via the sealed portion.

In some embodiments, the method 700 comprises, at block 704, positioning the electrical component on one of the first and second layers before attaching the first and second layers together (e.g., at block 104).

In some embodiments, the electrical component comprises an optoelectronic component for generating and/or detecting an optical signal. In this regard, the method 700 further comprises, at block 706, providing an optical element for manipulating the optical signal. The optical element may be provided between the first and second layers before attaching the first and second layers together. The sealed portion may be configured to prevent liquid ingress between the first and second layers towards the optical element.

In some embodiments, the method 700 comprises, at block 708, providing adhesive on at least one of the first and second layers for at least one of: attaching the first and second layers together; and adhering the electrical component to at least one of the first and second layers.

In some embodiments, at least one of the first and second layers comprises a flexible portion. In this regard, the method 700 may comprise, at block 710, applying a force to the device to cause the device to adopt a specified shape.

In some embodiments, the method 700 may comprise, as part of block 102, distributing the electrical component and at least one other component between the first and second layers in such a way that a substantially continuous stiffness is provided along the device created, at block 104, by attaching the first and second layers together.

In some embodiments, at least one of the first and second layers comprises a surface of an appliance. In this regard, the method 700 may comprise, at block 712, attaching the other of the first and second layers to the surface of the appliance to create the device. The device may therefore be simultaneously created and sealed to the surface of the appliance.

One or more features described in one embodiment may be combined with or replace features described in another embodiment. For example, the method 100 or 700 of FIG. 1 or 7 may be modified based on features described in relation to the device 200, 300, 400, 500, 600 of FIGS. 2, 3, 4, 5 and 6, and vice versa. Further, certain features of one of the device 200, 300, 400, 500, 600 may be combined with, replace or otherwise modify certain features of another of the devices 200, 300, 400, 500, 600.

The present disclosure is described with reference to flow charts and block diagrams of the method, devices and systems according to embodiments of the present disclosure. Although the flow charts described above show a specific order of execution, the order of execution may differ from that which is depicted. Blocks described in relation to one flow chart may be combined with those of another flow chart.

Elements or steps described in relation to one embodiment may be combined with or replaced by elements or steps described in relation to another embodiment. Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:
1. A method, comprising:
providing:
a first layer defining a first inner surface and a first outer surface;
a second layer defining a second inner surface and a second outer surface; and
an electrical component positioned on the first inner surface or the second inner surface; and
an electrical connection for the electrical component, wherein the electrical connection is printed on the first layer or the second layer; and
attaching the first and second layers together to create a device comprising the first and second layers with the electrical component and the electrical connection positioned between the first and second layers, so that the electrical component and electrical connection are in contact with both the first inner surface and the second inner surface, wherein the first outer surface and the second outer surface define an external surface of the device, the device further comprising a sealed portion defined by liquid-tight attachment between the first and second inner surfaces around the electrical connection, to prevent liquid ingress into the device along the electrical connection between the first and second layers towards the electrical component, wherein:
the electrical connection is configured to allow electrical communication with the electrical component via the sealed portion; and
an edge of the first layer is offset from an edge of the second layer such that a portion of the electrical connection printed on the first layer or the second layer is exposed for connecting to an electrical power supply.
2. The method of claim 1, wherein the electrical connection extends along the first inner surface or second inner surface and is exposed at an edge of one of the first and second layers to allow electrical communication with the electrical component.

3. The method of claim 1, wherein the portion of the electrical connection that is exposed extends along: the first layer on the same surface of the first layer as the first inner surface or the second layer on the same surface of the second layer as the second inner surface.

4. The method of claim 1, wherein the first and second layers are offset to expose the portion of the electrical connection.

5. The method of claim 1, comprising providing an isolating portion on part of the electrical connection before attaching the first and second layers together, wherein upon the first and second layers being attached together to create the device, the isolating portion extends:
   partway along the electrical connection such that the electrical connection extends between the first or second layer and the isolating portion and is exposed to allow electrical communication with the electrical component via the isolating portion and the sealed portion; and
   partway into the sealed portion of the device, between the first and second layers.

6. The method of claim 5, wherein the isolating portion is relatively thinner than the first layer or the second layer such that the combined thickness of the first or second layer, electrical connection and the isolating portion is less than the combined thickness of the first and second layers.

7. The method of claim 1, wherein the electrical component comprises an optoelectronic component for generating and/or detecting an optical signal, the method further comprising providing an optical element for manipulating the optical signal, wherein the optical element is provided between the first and second layers before attaching the first and second layers together, and wherein the sealed portion is configured to prevent liquid ingress between the first and second layers towards the optical element.

8. The method of claim 1, comprising providing adhesive on at least one of the first and second layers for at least one of: attaching the first and second layers together; and adhering the electrical component to at least one of the first and second layers.

9. The method of claim 1, wherein at least one of the first and second layers comprise a shape-adaptable portion, the method comprising applying a force to the device to cause the device to adopt a specified shape.

10. The method of claim 1, comprising distributing the electrical component and at least one other component between the first and second layers in such a way that a substantially continuous flexibility is provided along the device created by attaching the first and second layers together.

11. The method of claim 1, wherein at least one of the first and second layers comprises a surface of an appliance, the method comprising attaching the other of the first and second layers to the surface of the appliance to create the device.

12. A device, comprising:
   a first layer defining a first inner surface and a first outer surface
   a second layer defining a second inner surface and a second outer surface, wherein the first outer surface and the second outer surface define an external surface of the device;
   an electrical component positioned between the first and second layers; and
   an electrical connection, for the electrical component, positioned between the first and second layers, wherein the electrical connection is printed on the first layer or the second layer, wherein the electrical component and electrical connection are in contact with both the first inner surface and the second inner surface, wherein the first and second layers are attached together to form a sealed portion defined by liquid-tight attachment between the first and second inner surfaces around the electrical connection, to prevent liquid ingress into the device along the electrical connection between the first and second layers towards the electrical component, wherein:
   the electrical connection is configured to allow electrical communication with the electrical component via the sealed portion; and
   an edge of the first layer is offset from an edge of the second layer such that a portion of the electrical connection printed on the first layer or the second layer is exposed for connecting to an electrical power supply.

13. The device of claim 12, wherein the electrical component comprises an optoelectronic component for generating and/or detecting an optical signal.

14. The device of claim 13, further comprising an optical element for manipulating the optical signal.

15. The device of claim 13, wherein at least one of the first and second layers comprises a transparent portion for allowing transmission of the optical signal through at least one of the first and second layers.

* * * * *